United States Patent [19]

Yamazaki et al.

[11] Patent Number: 4,705,358

[45] Date of Patent: Nov. 10, 1987

[54] SUBSTRATE FOR ACTIVE MATRIX DISPLAY

[75] Inventors: Tsuneo Yamazaki; Shunichi Motte; Masafumi Shimbo, all of Tokyo, Japan

[73] Assignee: Seiko Instruments & Electronics Ltd., Tokyo, Japan

[21] Appl. No.: 743,093

[22] Filed: Jun. 10, 1985

[51] Int. Cl.[4] ................................ G02F 1/13
[52] U.S. Cl. .................... 350/334; 357/2; 357/23.7; 357/45; 357/49
[58] Field of Search ........ 357/23.7, 715, 4(U.S. only), 357/2, 30 D, 30 I, 30 G, 30 H, 30 K, 30 R, 45, 49; 350/334, 335, 336

[56] References Cited

U.S. PATENT DOCUMENTS 3,824,003 7/1974 Koda et al. .................. 357/23.7 X
4,431,271 2/1984 Okubo ......................... 357/23.7 X

FOREIGN PATENT DOCUMENTS 52-48475 4/1977 Japan ................... 357/23.7
53-121482 10/1978 Japan ................... 357/23.7

OTHER PUBLICATIONS

Matsuura, M., Takafuji, Y., Nonomura, K., Funada, F., Wada, T., "LCD Panel Using Te TFT Array", Proc. of the SID, vol. 24/Jan. 1984, pp. 17-20.

Primary Examiner—Andrew J. James
Assistant Examiner—Sara W. Crane
Attorney, Agent, or Firm—Bruce L. Adams; Van C. Wilks

[57] ABSTRACT

Insulated-gate-field-effect transistors are disposed on an insulating substrate as a matrix. Each gate electrode of the transistors is covered with each gate insulating film and semiconductor film acting as a channel of the transistors, respectively.

9 Claims, 6 Drawing Figures

SUBSTRATE FOR ACTIVE MATRIX DISPLAY

BACKGROUND OF THE INVENTION

This invention relates to a substrate for an active matrix display which is so designed as to limit the occurrence of structural defects in the manufacture thereof.

In recent years many significant achievements have been made in the development of substrates for active matrix displays in which thin-film transistors are arrayed on an insulating substrate such as glass substrate. Matrix display devices such as liquid crystal, electrochromic and electroluminescent displays having switch elements of thin-film transistors arrayed on an insulating substrate enable high-speed and high-resolution display of TV pictures.

FIG. 1 illustrates a circuitry of a conventional liquid crystal active matrix display. When a voltage is applied to a gate line or row electrode Xj to energize transistors 1 along the Xj line, picture signals from data lines or column electrodes Yi, Yi+1, . . . are passed through respective transistors 1 and written in capacitors 2. The written data signal is retained even after the gate line Xj has been turned off, thereby allowing continuous voltage application to liquid crystal cells 3. By scanning the gate lines so that they are turned on successively in the order of Xj, Xj+1, . . . , picture signals can be input to the whole screen to allow the picture display.

FIG. 2a is a plan view of a substrate used in a conventional liquid crystal active matrix display device, in which only one display picture element is illustrated. In FIG. 2a, 4 designates a gate electrode corresponding to gate line Xj of FIG. 1, 5 designates a semiconductor layer constituting an active region or a channel region of thin film transistor 1, 6 designates a data signal line for writing picture signals, which corresponds to data line Yi of FIG. 1, 7 designates a drain electrode of thin-film transistor 1, and 8 designates a transparent picture electrode for applying a voltage to the liquid crystal.

FIG. 2b is a sectional view taken along the line A—A' of FIG. 2a showing the inside portion of thin film transistor. It will be seen that a picture element consisting of gate electrode 4, gate insulating film or gate insulator 10, semiconductor layer 5, gate signal line 6, drain electrode 7, transparent electrode 8, insulating film 11, source 12 and drain 13 are formed on a transparent insulating substrate 9. Substrate 9 is made of glass or similar material and usually has a thickness of 0.2 to 2.0 mm. Gate electrode 4 is made of metal such as chromium, aluminum, or molybdenum. Gate insulating film 10 is made of silicon dioxide, silicon nitride or similar material. Semiconductor layer 5 is usually made of amorphous silicon not doped with impurities. Silicon dioxide, silicon nitride or similar material is used for insulating film 11. Data signal line 6 and drain electrode 7 are made of aluminum, and source 12 and drain 13 are made of n+ amorphous silicon. Transparent electrode 8 is made of indium-tin oxide (ITO). The thickness of each layer on substrate 9 is usually 0.05 to 1 μm. In the thin-film transistor of FIG. 2b, a voltage is applied to gate electrode 4 to form a channel at the interface of semiconductor layer 5 and gate insulating film 10, and a data signal from data signal line 6 is applied to transparent electrode 8.

In the conventional active matrix displays of the above-described structure, it is quite difficult, for several reasons, to achieve a faultless system. In constructing such conventional displays, as illustrated in FIG. 2c, when the semiconductor layer 5 is selectively etched, etching of the surface of the insulating layer 10 is likely to occur thereby exposing the gate electrode 4. The usual etching material, a mixture of the gases $CF_4$ and $O_2$ for dry etching, and a mixture of hydrofluoric acid, nitric acid, acetic acid and water for wet etching, can etch not only semiconductor layer 5 but also gate insulating film 10 so that it is quite likely that gate insulating film 10 on the gate electrode 4 will be eroded in the course of etching of the semiconductor layer 5. This phenomenon causes short-circuiting between such gate electrode 4 and data signal line 6 or semiconductor layer 5. In conventional displays as shown in FIG. 1, usually 200 to 300 picture elements are arrayed longitudinally and laterally in a row-by column matrix, so that it has been extremely difficult to construct a display system without structural defects at any of the tens of thousands of intersections such as illustrated in FIG. 2b.

SUMMARY OF THE INVENTION

It is an object of this invention to provide a substrate for active matrix displays which is free of defects of the prior art and safe from shortcircuiting between the data signal line and the gate signal line.

BRIEF DESCRIPTION OF THE DRAWINGS

FIG. 3b is a sectional view taken along the line D—D of FIG. 3a.

DETAILED DESCRIPTION OF PREFERRED EMBODIMENTS

Figure 2A:
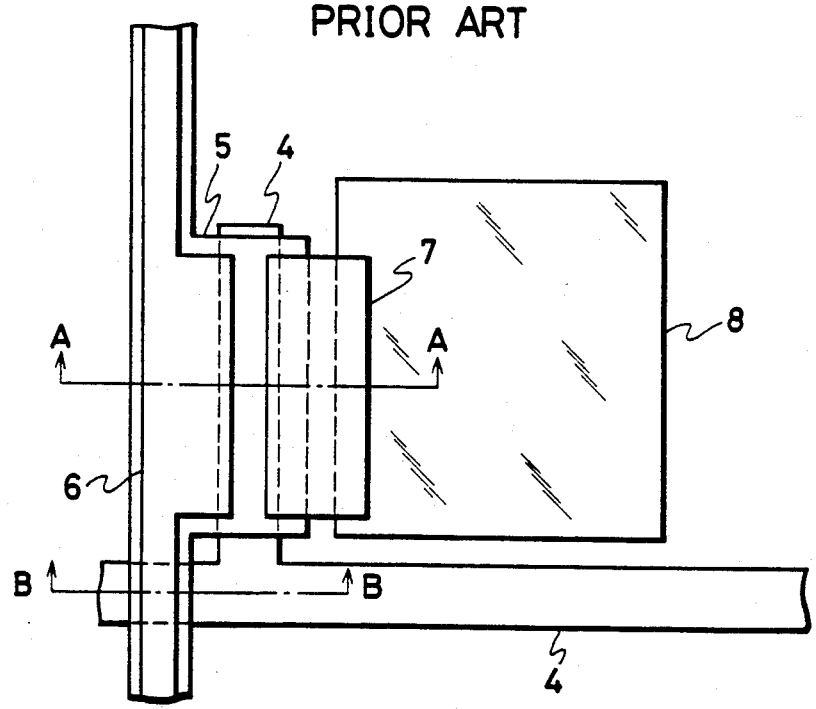
FIG. 2a is a plan view of a conventional substrate for active matrix liquid crystal display.

Hereinafter, the present invention will be described in accordance with an embodiment thereof while referring to the accompanying drawings. FIG. 3a is a plan view of a substrate for active matrix display in an embodiment of this invention. Reference numerals used in this drawing correspond to those in FIG. 2a. The sectional structure along the line C—C of FIG. 3a is identical with that of FIG. 2b. FIG. 3b is a sectional view taken along the line D—D of FIG. 3a. The designations of the structural parts in FIG. 3b also coincide with those in FIG. 2c.

Figure 1:
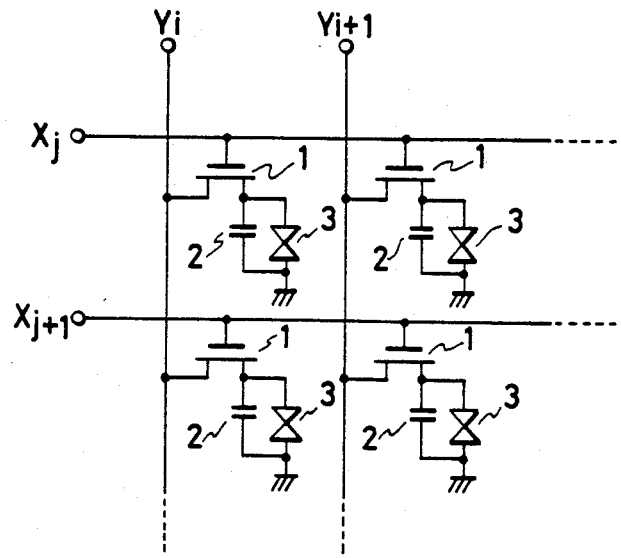
FIG. 1 is a circuit diagram of a liquid crystal active matrix display device.
Figure 2B:
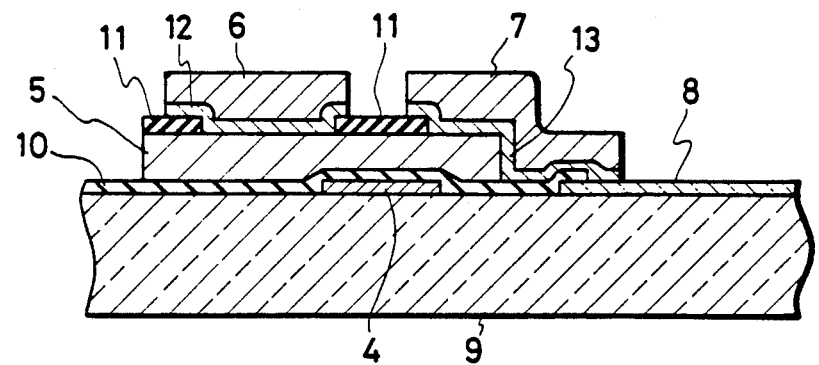
FIGS. 2b and 2c are sectional views taken along the lines A—A and B—B of FIG. 2a, respectively.
Figure 2C:
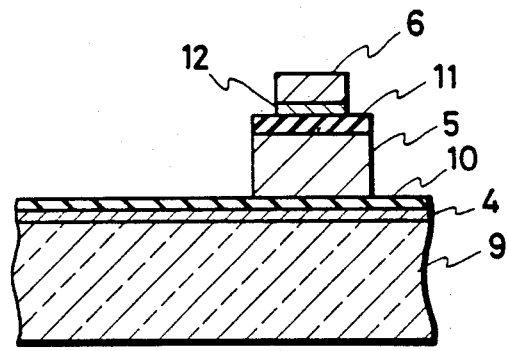
Figure 3A:
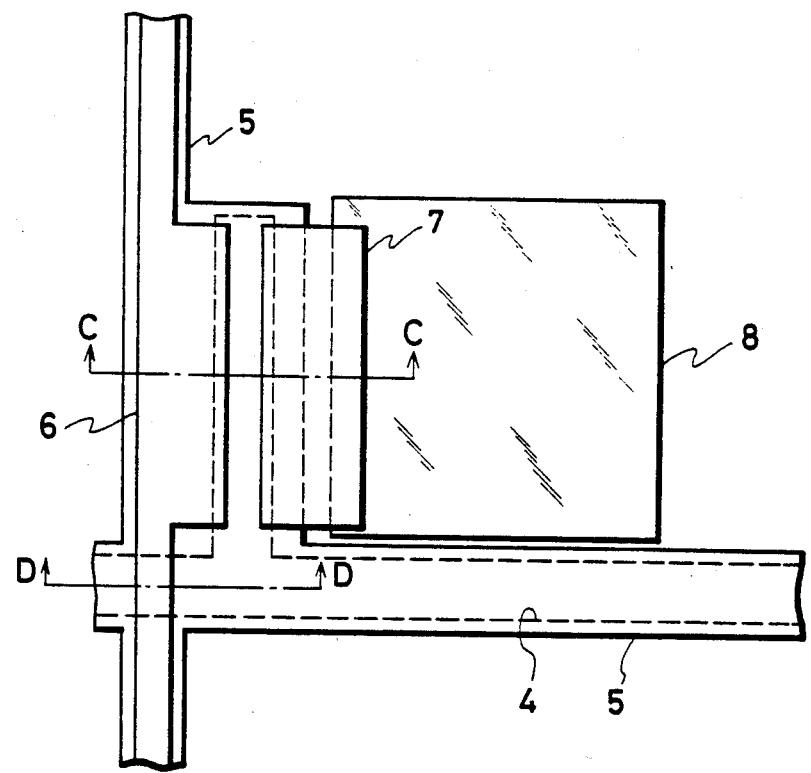
FIG. 3a is a plan view of a substrate for active matrix display according to this invention.
Figure 3B:
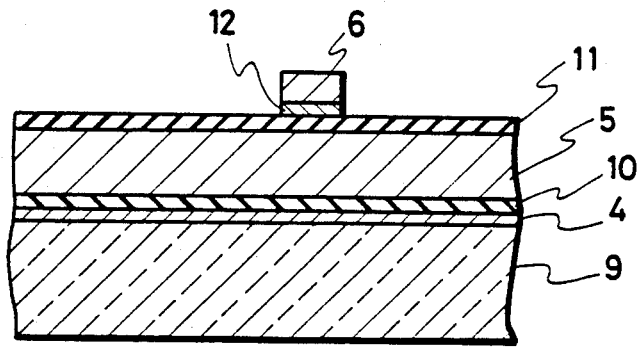

In the structure of FIG. 3b, semiconductor layer 5 is formed so as to cover gate electrode 4 unlike the arrangement in the structure of FIG. 2b. Because of this arrangement, when semiconductor 5 is selectively etched, there is no danger that the gate insulating film 10 on the gate electrode 4 will be eroded. Accordingly, the risk of short-circuiting between data signal line 6 and gate electrode 4 is greatly reduced and it is possible to achieve a high yield of the substrates for active matrix displays. In this embodiment of the invention, since semiconductor layer 5 is formed on gate electrode 4, it would be thought that there is the possibility of crosstalk between the adjoining data signal lines through semiconductor layer 5, but such a possibility is nonexistent for the following reason. There is no problem when gate electrode 4 is off because the specific resistance of amorphous silicon of semiconductor layer 5 is sufficiently high, $10^8$ Ω.cm or more. When gate electrode 4 is on, parasitic transistors are formed on the gate electrode 4, but the channel length of such parasitic transistors is almost equal to the picture element pitch, and the channel width of the parasitic transistor is several times less than that of transistor 1 for each picture element so that the parasitic transistors have a conductance which is up to 1/100 of that of picture element transistors 1. Therefore, although the load of the data signal line drive circuit varies slightly, no problem arises in practice because the output impedance is usually much smaller than that of loaded thin film transistors 1 (transistors shown in FIG. 1). Crosstalk from semiconductor layer 5 at regions other than transistors can be also limited by reducing the thickness of the semiconductor layer at other regions than the channel area of the transistor. Although no particular mention was made of a light shield for transistors, an opaque film covering the transistor channel area may be provided. Also, such a light shield may be provided so as to cover almost the entirety of semiconductor layer 5 bordering transparent picture element 8 excepting those areas necessary for electrode connection or other purposes.

The invention has been described relating to a liquid crystal active matrix display, but it will be apparent that the invention can as well be applied to a substrate for other types of active matrix displays such as electrochromic displays, electroluminescent displays and the like.

As described above, the substrate for active matrix displays according to this invention greatly reduces malfunctions due to short-circuiting between the gate signal lines and data signal lines in the manufacture thereof so that the production yield is greatly increased.

What is claimed is:

1. A substrate for an active matrix display comprising: an insulating substrate; insulated-gate-field-effect thin film transistors arranged in an X-by-Y matrix on said insulating substrate, each transistor comprising a gate electrode formed on said insulating substrate, a gate insulating film covering said gate electrode, a thin semiconductor film selectively formed on said gate insulating film, a source electrode and a drain electrode formed on said semiconductor film to define therebetween a channel region, and a transparent picture electrode formed in a region without said semiconductor film and connected to said drain electrode; gate signal lines elongated from said gate electrodes in an X direction and the overall portion of said gate signal lines at least in the area between said gate electrodes being covered with said gate insulating film and said thin semiconductor film extended from said channel regions; and data signal lines elongated from said source electrodes in a Y direction and being formed on said semiconductor film disposed on said gate insulating film.

2. A substrate for an active matrix display according to claim 1; wherein said semiconductor film of the channel region is thicker than the semiconductor film formed on said gate signal lines.

3. A substrate used for an active matrix display device comprising: a transparent insulating substrate; transparent picture electrodes arranged on the transparent insulating substrate in a row-by-column matrix; thin film transistors disposed adjacent to the transparent picture electrodes in the row-by-column matrix for applying data signals to the transparent picture electrodes, each thin film transistor comprising a gate electrode disposed on the transparent insulating substrate, a gate insulator comprised of an insulating film and covering the gate electrode, a channel region comprised of a semiconductor film and disposed on the gate insulator, and first and second electrodes disposed on the channel region and spaced apart from each other to define therebetween a channel in the channel region controlled by the gate electrode, the second electrode being connected to the transparent picture electrode; row electrodes extending from the gate electrodes of the rows of the thin film transistors for applying gate signals to the gate electrodes to control the channels; column electrodes for applying the data signals to the first electrodes of the columns of the thin film transistors; and means comprised of the insulating film and the semiconductor film and covering over the row electrodes and lying under the column electrodes to an extent sufficient to electrically isolate the transistor channel regions one from another for electrically insulating the row electrodes and column electrodes from each other, the means bordering but not covering the transparent picture electrodes for enabling incident light to be transmitted through the transparent picture electrodes.

4. A substrate according to claim 3; wherein the semiconductor film of the channel region is thicker than the semiconductor film of the means for insulating the row electrodes and column electrodes from each other.

5. A substrate according to claim 3; wherein the first electrode comprises a source electrode of the thin film transistor, and the second electrode comprises a drain electrode of the thin film transistor.

6. A substrate according to claim 3; wherein the means further comprises an additional insulating film disposed on the semiconductor film opposite to the insulating film.

7. A substrate according to claim 3; wherein the semiconductor film comprises amorphous silicon.

8. A substrate according to claim 3; wherein the insulating film comprises silicon dioxide.

9. A substrate according to claim 3; wherein the insulating film comprises silicon nitride.

* * * * *